United States Patent
Drofenik et al.

(10) Patent No.: US 9,826,665 B2
(45) Date of Patent: Nov. 21, 2017

(54) ELECTRICAL POWER CIRCUIT ASSEMBLY

(71) Applicant: ABB Schweiz AG, Baden (CH)

(72) Inventors: Uwe Drofenik, Zürich (CH); Till Huesgen, Bad Säckingen (DE); Andreas Ecklebe, Dietikon (CH)

(73) Assignee: ABB Schweiz AG, Baden (CH)

( * ) Notice: Subject to any disclaimer, the term of this patent is extended or adjusted under 35 U.S.C. 154(b) by 114 days.

(21) Appl. No.: 13/770,258

(22) Filed: Feb. 19, 2013

(65) Prior Publication Data
US 2013/0235530 A1   Sep. 12, 2013

(30) Foreign Application Priority Data
Mar. 6, 2012 (EP) .................................. 12158288

(51) Int. Cl.
*H05K 7/20* (2006.01)
(52) U.S. Cl.
CPC ......... *H05K 7/209* (2013.01); *H05K 7/20518* (2013.01)
(58) Field of Classification Search
USPC ....................................... 361/715, 717, 749
See application file for complete search history.

(56) References Cited

U.S. PATENT DOCUMENTS

| | | | |
|---|---|---|---|
| 5,373,418 A | 12/1994 | Hayasi | |
| 5,623,399 A | 4/1997 | Ishii et al. | |
| 6,304,448 B1 | 10/2001 | Fukada et al. | |
| 6,625,025 B1 | 9/2003 | Duxbury et al. | |
| 2006/0043411 A1* | 3/2006 | Bhattacharyya | G11C 11/39 257/138 |
| 2006/0232942 A1* | 10/2006 | Nakatsu et al. | 361/710 |
| 2010/0259898 A1 | 10/2010 | Kimura et al. | |
| 2012/0256704 A1* | 10/2012 | Johnson | A61N 1/3718 333/185 |

FOREIGN PATENT DOCUMENTS

| | | |
|---|---|---|
| DE | 19813365 A1 | 11/1998 |
| DE | 10054962 A1 | 9/2001 |
| EP | 0449640 A1 | 10/1991 |
| EP | 2261973 A2 | 12/2010 |

OTHER PUBLICATIONS

European Search Report dated Sep. 21, 2012, for European Application No. 12158288.6.

* cited by examiner

*Primary Examiner* — Andargie M Aychillhum
(74) *Attorney, Agent, or Firm* — Taft Stettinius & Hollister LLP

(57) ABSTRACT

An electrical power circuit assembly includes a heat sink having a first surface portion and a second surface portion, a power semiconductor module being in thermal contact with the first surface portion of the heat sink for dissipating heat from the power semiconductor module to the heat sink via the first heat sink surface portion, and a capacitor having an axis. The capacitor is arranged with its axis essentially parallel to the second heat sink surface portion and with a circumferential surface portion being in thermal contact with the second surface portion of the heat sink for dissipating heat from the capacitor to the heat sink via the second heat sink surface portion.

25 Claims, 2 Drawing Sheets

ELECTRICAL POWER CIRCUIT ASSEMBLY

RELATED APPLICATION

This application claims priority under 35 U.S.C. §119 to European Patent Application 12158288.6 filed in Europe on Mar. 6, 2012, the entire content of which is hereby incorporated by reference in its entirety.

FIELD

The present disclosure generally relates to an electrical power circuit assembly. More particularly, the present disclosure relates to an electrical circuit assembly which includes a power semiconductor module, a capacitor, and a heat sink for cooling the power semiconductor module and the capacitor.

BACKGROUND INFORMATION

With an increasing power density, thermal management becomes a more important issue in power electronic equipment. For cooling a power circuit assembly, a fan can be used. In addition, some components can be directly attached to a heat sink. In particular, a power module, which can be the main contributor to losses in power electronic equipment, is mounted directly onto a heat sink to keep the semiconductor temperatures in an acceptable range.

If other components, such as control electronics, an auxiliary supply, balancing resistors and the like would be attached to the same heat sink, there would be a risk that these other components are overheated by excessive heat from the power module, instead of being cooled. Cooling of these other components can be performed by a separate cooling mechanism, such as by attaching them to the housing or to another heat sink. However, this increases the complexity of the equipment since several cooling paths now have to be implemented and considered. This may also lead to restrictions on where such power equipment can be placed.

These issues are particularly relevant in the case of a power circuit assembly having a high ingress protection class. For many applications, such as the food and beverage industry, a high ingress protection class (IP class) is involved. In those high IP classes, the electronic components are enclosed by a sealed housing, and thus provided in a so-called clean room which is provided inside the housing and thus separated from the outside (dirty room) by the housing. This leads to additional restrictions on the cooling.

Further, capacitors in a power circuit assembly may not be placed freely, if additional stray capacities and/or parasitic inductances due to their electrical wiring are to be avoided, for example, to keep over-voltages and switching losses small. The capacitors may then need to be placed close to the power module for avoiding such stray capacities. This requirement, combined with the necessity of separate cooling, can result in an arrangement where the capacitors are standing on top of the circuit main board, which allows a wiring with minimum parasitic inductances. The capacitor may then be cooled by means of a fan. With this arrangement, the capacitors define the minimum height of the housing due to their shape (e.g., cylinders with height larger than diameter). The resulting large volume of the housing directly limits the power density of the converter.

SUMMARY

An exemplary embodiment of the present disclosure provides an electrical power circuit assembly which includes a heat sink having a first surface portion and a second surface portion arranged in a common plane, and a region of reduced thermal conductivity provided between the first surface portion and the second surface portion. The exemplary electrical power circuit assembly also includes a power semiconductor module being in thermal contact with the first surface portion of the heat sink for dissipating heat from the power semiconductor module to the heat sink via the first heat sink surface portion. In addition, the exemplary electrical power circuit assembly includes a capacitor having an axis and a circumferential surface portion. The capacitor is arranged so that the axis of the capacitor is essentially parallel to the second heat sink surface portion and the circumferential surface portion is in thermal contact with the second surface portion of the heat sink for dissipating heat from the capacitor to the heat sink via the second heat sink surface portion.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
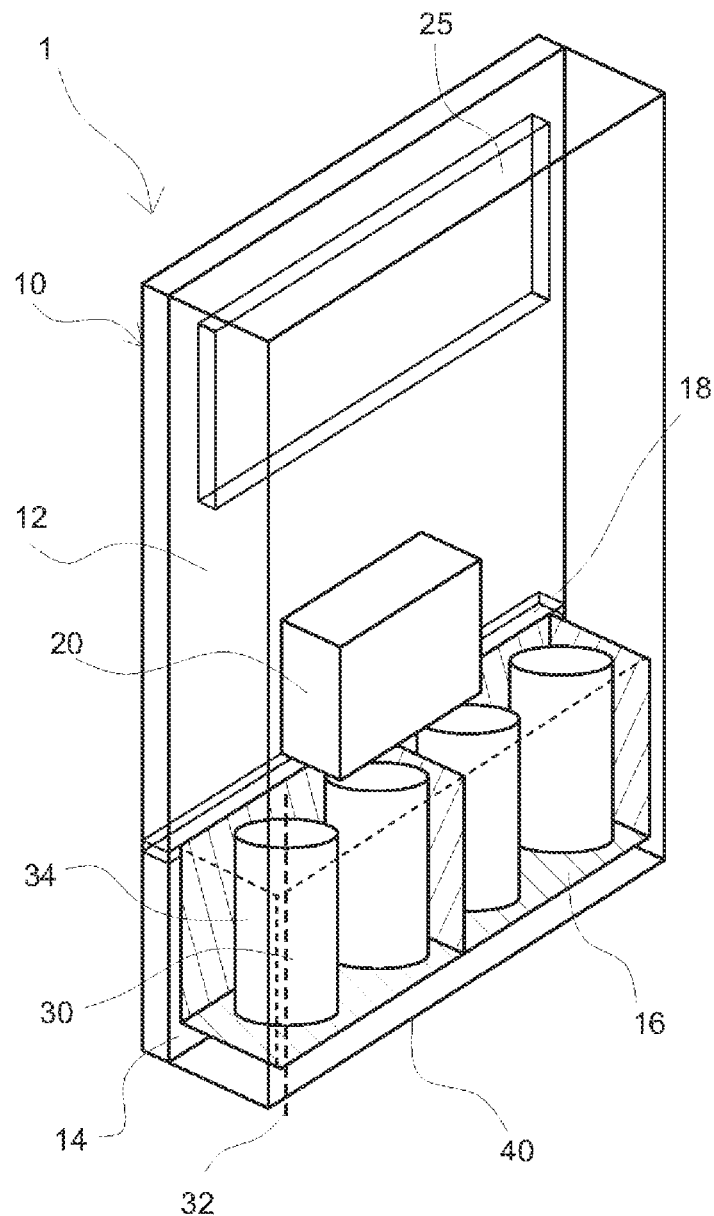
FIG. 1 is a perspective view of an electrical power circuit assembly according to an exemplary embodiment of the present disclosure.

Exemplary embodiments of the present disclosure provide a power circuit assembly which allows a compact design (and thus high power density) but also efficient cooling and excellent electrical properties.

The above-described features are achieved by an electrical power circuit assembly a converter including the electrical power circuit assembly, according to exemplary embodiments of the present disclosure described herein. Further aspects, advantages, and features of the present disclosure are described with reference to exemplary embodiments illustrated in the attached drawings.

According to an exemplary embodiment, an electrical power circuit assembly includes a heat sink having a first surface portion and a second surface portion, a power semiconductor module which is in thermal contact with the first surface portion of the heat sink for dissipating heat from the power semiconductor module to the heat sink via the first heat sink surface portion, and a capacitor having an axis. The capacitor is arranged with its axis essentially parallel to the second heat sink surface portion and with a circumferential surface portion being in thermal contact with the second surface portion of the heat sink for dissipating heat from the capacitor to the heat sink via the second heat sink surface portion.

Reference will now be made in detail to exemplary embodiments of the present disclosure, one or more examples of which are illustrated in the drawings. Each example is provided by way of explanation of the present disclosure and is not meant as a limitation of the present disclosure. Any features illustrated or described herein as part of one embodiment can be used on or in conjunction with other embodiments to yield yet a further embodiment. It is intended that the description includes such modifications and variations.

Figure 2:
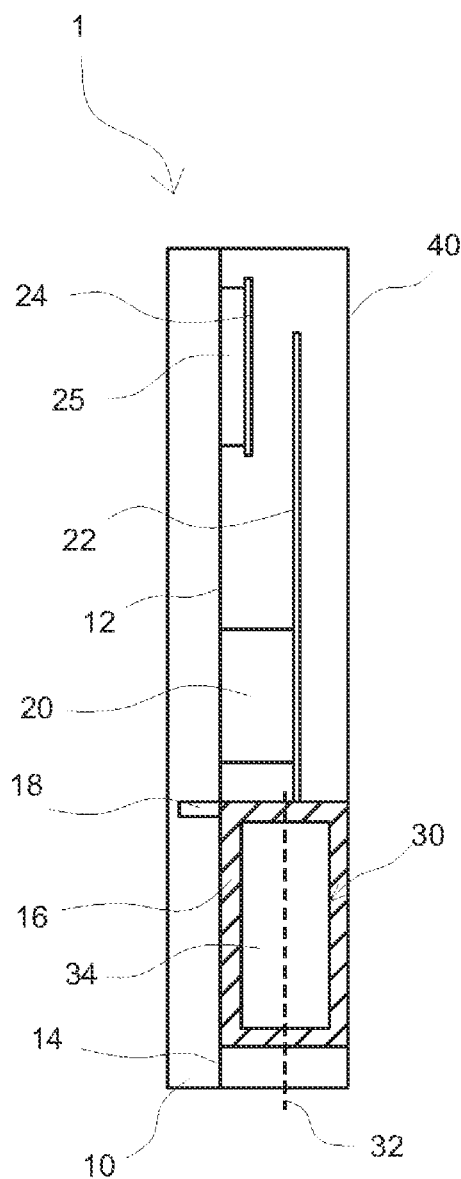
FIG. 2 is a cross-sectional side view of the electrical power circuit assembly of FIG. 1.

FIGS. 1 and 2 show an electrical power circuit assembly 1 having a heat sink 10, a power semiconductor module 20, a circuit board 22, capacitors 30 and a sealed housing 40. The heat sink 10 has a first surface portion 12 and a second surface portion 14, which are separated by a region of reduced thermal conductivity 18. The capacitors 30 each have an axis 32 and a circumferential surface 34. Further, the capacitors 30 are embedded in a thermally conductive structure 16. Besides the (main) circuit board, an additional control circuit board 24 (not shown in FIG. 1) is or can be attached to the heat sink 10 via a thermal interface 25.

In the remainder of the description, some further general features and embodiments of the disclosure are described. Any features illustrated or described herein as part of one embodiment can be used on or in conjunction with other embodiments to yield yet a further embodiment. It is intended that the description includes such modifications and variations. Within the following description, the reference numbers refer to FIGS. 1 and 2 merely for the purpose of illustration, but this does not necessarily limit the respective embodiment to include other features shown in the drawing.

First, the heat sink 10 is described in more detail. The surface portions 12, 14 of the heat sink 10 are provided at plate-like respective (first and second) heat sink portions. The surface portions 12, 14 are parallel to each other. Moreover, the surface portions 12, 14 are arranged in the same plane, without a step therebetween. The heat sink 10 may be formed as a continuous plate or as a plurality of plates attached to each other (e.g., respective plate-like heat sink portions for each of the surface portions 12, 14).

The region of reduced thermal conductivity 18 is provided between the surface portions 12 and 14 (or between the first and second heat sink portions mentioned above), and thereby acts as a thermal barrier which reduces the heat flow between the surface portions 12 and 14 (heat sink portions). Herein, the term "reduced thermal conductivity" is to be understood as a thermal conductivity which is lower (possibly by 50% or more, for example) than the thermal conductivity of the heat sink at the first surface portion 12 and at the second surface portion 14.

In accordance with an exemplary embodiment, the region of reduced thermal conductivity 18 can be implemented as a thinned section of the heat sink 10 due to a groove in the heat sink. For example, the groove may have a depth which is more than 50% of the thickness of the heat sink 10 at the first or second surface portion 12 or 14, the thickness being measured orthogonal to the first or second surface, respectively.

This groove allows the heat sink 10 to be formed as a single body which includes the first and the second surface portions 12, 14, while still having the region of reduced thermal conductivity therebetween. Further, the single-body heat sink 10 may also serve as EMC protection, besides its function for cooling.

In accordance with an exemplary embodiment, the groove and the first and the second surface portions 12, 14 can be provided on the same side of the heat sink 10, for example, at the inside of the housing 40.

The heat sink 10 may have almost any shape, as long as it has the first and the second surface portions 12, 14. Its material may also vary and include, for example, aluminum or copper.

On the side of the heat sink 10 opposite to the first and the second surface portions 12, 14 (e.g., the outside of the housing 40), or inside the heat sink 10, there may be a passage for a cooling fluid, for example, cooling gas, but also pipes for a cooling fluid may be attached to the heat sink 10.

Next, the power semiconductor module 20 is described in more detail. The power semiconductor module 20 (e.g., a module comprising a power semiconductor device, such as an IGBT and/or a thyristor) produces heat during operation. For dissipating this heat, the power semiconductor module 20 is in thermal contact with the first surface portion 12 of the heat sink 10. Herein, thermal contact is generally understood to mean contact via solid bodies, such that a solid heat flow path is established from the power semiconductor module 20 out of this module and then through thermal flow in the solid bodies to the first surface portion 12. The thermal contact may be by direct mechanical contact, or by mechanical contact via a thermal paste or another interposed thermal coupling body. The thermal contact allows the heat to be dissipated from the power semiconductor module 20 to the heat sink 10 via the first heat sink surface portion 12.

Next, the capacitors 30 are described in more detail. For definiteness, only one of the capacitors 30 will be described. Indeed, the power circuit assembly may include only one capacitor. In the case of a plurality of capacitors 30, as shown in FIGS. 1 and 2, the following description may apply to just one of the capacitors 30 or to several ones or to each one of the capacitors 30.

The capacitor 30 has an axis 32, along which the capacitor 30 extends between its axial ends. The axis 32 can have, but need not have an approximate symmetry axis or an approximate center of a symmetry plane of the capacitor 30. If the capacitor 30 is a rolled capacitor, the axis 32 can be its rolling axis. The capacitor may be, but need not be cylindrical. The capacitor has end surfaces at each axial end and a circumferential surface 34 extending along and about the axis 32. In accordance with an exemplary embodiment, the axial length of the capacitor 30 is longer than the diameter orthogonal to the axis 32, possibly even more than 1.5 times the diameter, for example.

The capacitor 30 is arranged with its axis 32 essentially parallel to the second heat sink surface portion 14. This arrangement avoids excessive thickness in the direction orthogonal to the heat sink 10 (e.g., to the surface portions 12, 14 of the heat sink). Thereby, the arrangement allows for a good cooling as well as a compact electrical power circuit assembly.

Further, this arrangement allows terminals of the capacitor, which may be arranged at or near one of the axial ends of the capacitor, to be on the side of the power module 20, when viewed in a cross-sectional plane parallel to the heat sink surface portion 12 or 14. This, in turn, allows a connection between the capacitor and other equipment of the electrical power circuit assembly to be short, thereby avoiding parasite inductances and stray capacitances. Independently of any specific embodiment, the capacitor may be a DC link capacitor and/or may be connected to the semiconductor power module.

In FIGS. 1 and 2, electrical connections have been omitted for the sake of simplicity. For example, the power semiconductor module 20 may be connected to other power semiconductor module(s) (optional and not shown), to the capacitor(s) 30, to the control board 24 (e.g., including a digital signal processor) and to external terminals of the device. The connections are implementable in several alternative ways, for example, by a low-inductance busbar system between the power semiconductor module 20, the capacitor(s) 30 and possibly the control board 24.

In accordance with an exemplary embodiment, there may be a connection with reduced parasite inductances. To this purpose, the capacitor 30 may be coupled to the power semiconductor module 20 by an electrical line having a length of, for example, less than 50 mm (e.g., between 10 mm and 40 mm). The electrical line may extend from a capacitor terminal at an axial end side of the capacitor 30 to the power semiconductor module 20.

In the exemplary embodiment of FIGS. 1 and 2, the line which connects the capacitor 30 to the power semiconductor module 20 is provided on the circuit board 22. The circuit board 22 contacts the power semiconductor module 20 at a side of the power semiconductor module 20 opposite to the heat sink 10. An end of the circuit board 22 is in close proximity to an axial end of the capacitor 30. The circuit board 22 is parallel to the surface portions 12, 14 of the heat sink.

A portion of the capacitor's circumferential surface 34—which is not necessarily, but possibly the entire circumferential surface—is in thermal contact with the second surface portion 14 of the heat sink 10. This thermal contact allows heat to be dissipated from the capacitor 30 to the heat sink 10 via the circumferential surface 34 and the second heat sink surface portion 14. Again, the thermal contact is such that a heat flow path through solid bodies is established from the capacitor's 30 circumferential surface out of this capacitor and through thermal flow in the solid bodies to the second surface portion 14.

The thermal contact may be by direct mechanical contact, or by mechanical contact via a thermal paste or another interposed thermal coupling body. For example, FIGS. 1 and 2 show a thermally conductive structure (filler) 16 which is in contact with the second surface portion 14 and fills the space between the circumferential surface 34 portion and the second heat sink surface portion 14 at least partially to allow a thermal contact there between. The structure 16 has a surface adapted to the shape of the circumferential surface 34 portion and is in contact with the circumferential surface 34 portion. With this arrangement, the heat is dissipated from the capacitor 30 to the heat sink 10 via the circumferential surface 34, and also via the thermally conductive structure 16 and the second heat sink surface portion 14.

In the case of a plurality of capacitors 30, as shown in FIGS. 1 and 2, these capacitors 30 are arranged with their respective axes 32 parallel to each other (and to the second heat sink surface portion 14). The description of any feature herein applies to each of the capacitors.

The capacitor 30 and the power semiconductor module 20 are arranged on the same side of the respective first and second surface portions 12, 14. This side is the inside of the housing (clean zone in case of a sealed housing).

Next, further details regarding the housing are described. The housing 40 is sealed. In accordance with an exemplary embodiment, the housing 40 is adapted for an Ingress protection class of IP21 or higher. The power semiconductor module 20 and the capacitor 30 are arranged within an inside volume of the sealed housing 40. The heat sink 10 is provided as a part of the housing wall, which separates an inside from an outside of the sealed housing 40. Thereby, the heat sink 10 is arranged such that it can transport heat from the inside to the outside.

As a general aspect, the inside of the housing 40 is passively cooled, for example, no active cooling element such as a fan is arranged within the sealed housing 40.

The electrical power circuit assembly described herein may be used as a part of a converter and/or of a variable speed drive. Generally, the electrical power circuit assembly may be arranged such that the heat sink 10 is standing substantially vertically upright (e.g., with a tolerance of 15% or less), with the capacitor 30 underneath the power semiconductor module 20.

Next, some further possible variations of any embodiment are described. In one variation, a second heat sink might be provided. The second heat sink may be arranged on a side opposite to the (first) heat sink 10. The second heat sink may have a surface portion (in the following referred to as second heat sink surface portion) which is parallel to the surface portion 12. The second heat sink surface portion may contact the power semiconductor module 20 from a side opposite to the surface portion 12. In this manner, the power semiconductor module 20 may be sandwiched between the two heat sinks from two opposite sides. Similarly, a further surface portion of the second heat sink may contact the capacitor 30 from a side opposite to the surface portion 14.

The heat sink 10 may include two bodies, a first body with the surface portion 12 and a second body with the surface portion 14. These two bodies may be separated by a thermally insulating material which seals the housing 40. The surface portions 12 and 14 may be parallel to each other and may be arranged in the same plane, without a step therebetween.

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. An electrical power circuit assembly comprising:
a heat sink having a first surface portion and a second surface portion arranged in a common plane, and a region of reduced thermal conductivity arranged between the first surface portion and the second surface portion;
a power semiconductor module including one or more power semiconductor devices, the power semiconductor module being in thermal contact with the first surface portion of the heat sink for dissipating heat from the one or more power semiconductor devices of the power semiconductor module to the heat sink via the first heat sink surface portion; and
a capacitor having an axis and a circumferential surface portion,
wherein the capacitor is arranged so that the axis of the capacitor is essentially parallel to the second heat sink surface portion and the circumferential surface portion is in thermal contact with the second surface portion of the heat sink for dissipating heat from the capacitor to the heat sink via the second heat sink surface portion and wherein the power semiconductor module contacts only the first surface portion of the heat sink, the capacitor contacts only the second portion of the heat sink and that the region of reduced thermal conductivity separates the first and second portions of the heat sink.

2. The electrical power circuit assembly according to claim 1, wherein the first surface portion is arranged at a plate-like first heat sink portion, and the second surface portion is arranged at a plate-like second heat sink portion.

3. The electrical power circuit assembly according to claim 1, wherein the first surface portion and the second surface portion are parallel to each other.

4. The electrical power circuit assembly according to claim 3, wherein the heat sink is formed as a single body having the first surface portion and the second surface portion.

5. The electrical power circuit assembly according to claim 4, wherein the region of reduced thermal conductivity is a thinned section due to a groove in the heat sink, the groove being arranged between the first surface portion and the second surface portion.

6. The electrical power circuit assembly according to claim 5, comprising:
a thermally conductive structure in contact with the second surface portion, the conductive structure having a surface adapted to the shape of the circumferential surface portion and being in contact with the circumferential surface portion for dissipating heat from the capacitor to the heat sink via the circumferential surface portion of the capacitor, the conductive structure and the second heat sink surface portion.

7. The electrical power circuit assembly according to claim 5, comprising:
a sealed housing,
wherein the power semiconductor module and the capacitor are arranged within a space inside of the sealed housing, and
wherein the heat sink is arranged for transporting the heat to a space outside of the sealed housing.

8. The electrical power circuit assembly according to claim 5, wherein the capacitor and the power semiconductor module are on the same side of the respective first and second surface portions.

9. The electrical power circuit assembly according to claim 3, wherein the heat sink is formed as a single body having the first surface portion and the second surface portion.

10. The electrical power circuit assembly according to claim 9, wherein the region of reduced thermal conductivity is a thinned section due to a groove in the heat sink, the groove being arranged between the first surface portion and the second surface portion.

11. The electrical power circuit assembly according to claim 3, wherein the region of reduced thermal conductivity is a thinned section due to a groove in the heat sink, the groove being arranged between the first surface portion and the second surface portion.

12. The electrical power circuit assembly according to claim 1, wherein the heat sink is formed as a single body having the first surface portion and the second surface portion.

13. The electric power circuit assembly according to claim 12, wherein the region of reduced thermal conductivity is a thinned section due to a groove in the heat sink, the groove being arranged between the first surface portion and the second surface portion.

14. The electrical power circuit assembly according to claim 1, wherein the region of reduced thermal conductivity is a thinned section due to a groove in the heat sink, the groove being arranged between the first surface portion and the second surface portion.

15. The electrical power circuit assembly according to claim 1, wherein the capacitor is a rolled capacitor, the axis being the rolling axis of the capacitor.

16. The electrical power circuit assembly according to claim 1, comprising: a thermally conductive structure in contact with the second surface portion, the conductive structure having a surface adapted to the shape of the circumferential surface portion and being in contact with the circumferential surface portion for dissipating heat from the capacitor to the heat sink via the circumferential surface portion of the capacitor, the conductive structure and the second heat sink surface portion.

17. The electrical power circuit assembly according to claim 16 wherein the capacitor is embedded in the thermally conductive structure.

18. The electrical power circuit assembly according to claim 16 wherein the thermally conductive structure is in contact with the second surface portion and fills the space between the circumferential surface portion and the second heat sink surface portion at least partially to allow a thermal contact therebetween.

19. The electrical power circuit assembly according to claim 1, comprising: a plurality of capacitors arranged with their respective axes parallel to each other.

20. The electrical power circuit assembly according to claim 1, wherein the capacitor and the power semiconductor module are on the same side of the respective first and second surface portions.

21. The electrical power circuit assembly according to claim 1, comprising: a circuit board which is parallel to the first surface portion.

22. The electrical power circuit assembly according to claim 1, comprising: a sealed housing,
wherein the power semiconductor module and the capacitor are arranged within a space inside of the sealed housing, and
wherein the heat sink is arranged for transporting the heat to a space outside of the sealed housing.

23. The electrical power circuit assembly according to claim 22, wherein the housing is configured for high Ingress protection class.

24. A converter comprising the electrical power circuit assembly according to claim 1.

25. The electrical power circuit assembly according to claim 1 wherein the one or more power semiconductor devices include at least one of an IGBT and a thyristor.

\* \* \* \* \*